United States Patent
Huang

Patent Number: 5,359,209
Date of Patent: Oct. 25, 1994

[54] EFFICIENT LIGHT EMITTING DIODES WITH MODIFIED WINDOW LAYERS

[76] Inventor: Kuo-Hsin Huang, 10-1F, No. 36, Sec. 1, Kwang Fu Road, Hsinchu City, Taiwan

[21] Appl. No.: 164,915

[22] Filed: Dec. 9, 1993

[51] Int. Cl.⁵ .............. H01L 29/161; H01L 29/205; H01L 29/225; H01L 33/00
[52] U.S. Cl. ........................ 257/94; 257/13; 257/103
[58] Field of Search ............ 257/12, 13, 14, 94, 257/103

[56] References Cited

U.S. PATENT DOCUMENTS

| | | |
|---|---|---|
| 4,680,602 | 7/1987 | Watanabe et al. ............ 257/94 |
| 4,901,326 | 2/1990 | Hayakawa et al. ............ 257/12 |
| 5,048,035 | 9/1991 | Sugawara et al. ............ 257/94 |

*Primary Examiner*—Jerome Jackson
*Assistant Examiner*—Nathan K. Kelley

[57] ABSTRACT

A light emitting diode includes a first conductivity type semiconductor substrate, a basic AlGaInP double heterostructure and two window layers of second conductivity type semiconductor. A layer of first conductivity type AlGaInP an undoped AlGaInP layer and a layer of second conductivity type AlGaInP form the double heterostructure. The AlGaInP layers are epitaxially grown above the substrate sequentially. The window layers contain one layer of GaAs and the other layer of GaP. The first window layer is formed by epitaxially growing GaAs over the AlGaInP heterostructure. The second window layer is formed by growing GaP directly on the first window layer using either OMVPE or vapor phase epitaxy (VPE) technology. The inclusion of a GaAs window layer increases current spreading and, hence, the efficiency of the device. The yield rate of manufacturing the light emitting diode is also increased because the quality of GaP layer surface is improved.

4 Claims, 1 Drawing Sheet

EFFICIENT LIGHT EMITTING DIODES WITH MODIFIED WINDOW LAYERS

FIELD OF THE INVENTION

The invention relates to a semiconductor light emitting device, and more specifically to an AlGaInP double heterostructure light emitting device.

BACKGROUND OF THE INVENTION

Light emitting diodes using a double heterostructure AlGaInP have been demonstrated in recent years. A typical double heterostructure AlGaInP device has a GaAs n-type absorbing substrate on which several epitaxial layers are grown to form the light emitting device. An n-type confining layer of AlGaInP is first grown on the GaAs substrate. An active layer of undoped AlGaInP is then grown on the confining layer. The next layer is a top confining layer of p-type AlGaInP. The efficiency of such a light emitting device depends on the current spread in the top layer. Because of the high resistivity in the top p-type AlGaInP layer, the spread of current is generally small. Such a layer is typically very resistive and the light output is relatively low. Increase of the thickness in the top confining layer can widen the current spread and improve the efficiency of the light output. Nevertheless, it has been difficult to grow a thick AlGaInP layer.

Several techniques have been presented to improve the efficiency of double heterostructure AlGaInP light emitting devices. One technique involves forming a current blocking layer of high band gap and more electrically conductive material, such as GaAlAs, with various shapes of current blocking regions and structures above the top p-type AlGaInP layer to increase the current density. This technique has been known to be suitable for relatively long wavelength light such as red or orange. However, it does not work well in the shorter wavelength range, such as green and yellow. Another technique uses a lattice mismatched GaP window layer on top of the upper AlGaInP confining layer. The technique requires growing a fairly thick layer of GaP above the AlGaInP layer. Threading dislocations and stacking faults often occur near the mismatched GaP and AlGaInP interface due to the difficulty in growing GaP layer directly on top of the AlGaInP layer. The long term reliability and stability remain as a big concern in such a light emitting diode because of the generally rough interface structure.

SUMMARY OF THE INVENTION

The present invention has been made to provide a high efficiency double heterostructure light emitting diode. According to the invention, the light emitting diode uses a conventional double heterostructure which has a n-type GaAs substrate, a n-type AlGaInP lower confining layer grown on the substrate, an undoped active AlGaInP layer and a p-type AlGaInP upper confining layer. A double-layer window structure having a first thin layer of GaAs and a second layer of GaP is formed on top of the upper confining layer.

In the present invention, the first layer GaAs of the double-layer window can be made lattice-matched to the AlGaInP. The second layer GaP of the window can then be grown with high quality surface structure between the GaAs and GaP interface. GaAs is opaque material that has a smaller band gap than the band gap of the active layer. GaP is transparent material that has a higher band gap than the active layer band gap. The smaller band gap GaAs layer has a higher conductivity. Therefore, the inclusion of the GaAs layer not only improves the interface structure of the device but also increases the current spreading. The thickness of the window structure can also be reduced because of the higher overall conductivity in the window structure according to this invention.

DETAILED DESCRIPTION OF THE PREFERRED EMBODIMENT

Figure 1:
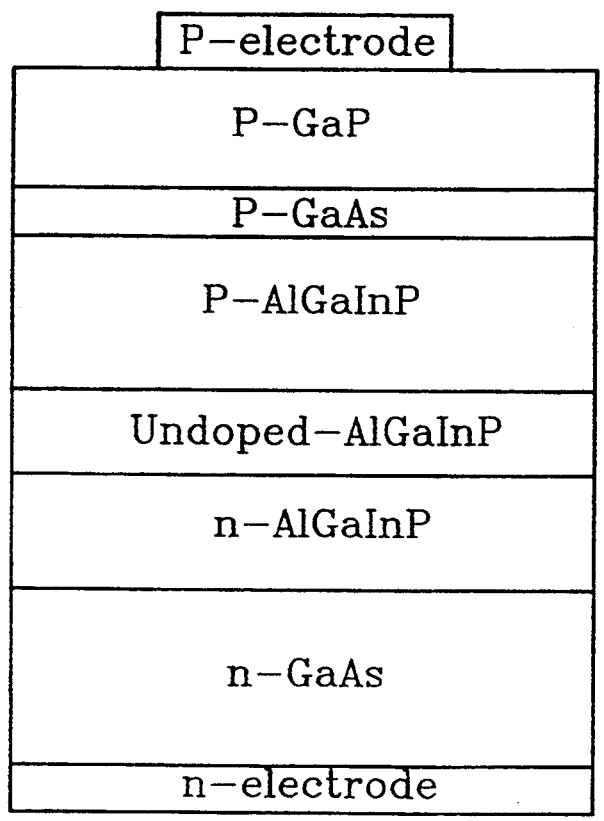
FIG. 1 shows a cross-sectional view of a double heterostructure light emitting diode according to the present invention.

The schematic cross-sectional view of the present invention is shown in FIG. 1. The substrate of the light emitting device is n-type GaAs material. The thickness of the substrate is in the range of 250 to 300 μm. A layer of n-type AlGaInP is epitaxially grown directly upon the GaAs substrate using the technology of organometallic vapor phase epitaxy (OMVPE). The n-type AlGaInP layer has a thickness in the range of 0.1 to 2 μm. Above the n-type AlGaInP layer is an active layer of undoped AlGaInP. A p-type AlGaInP layer is then grown on top of the active region. Both the active region and the p-type layer are sequentially grown with OMVPE method. Their thicknesses range from 0.1 to 2 μm typically.

To form the window layers of the light emitting diode in this invention, a p-type thin layer of lattice-matched material, such as GaAs that has smaller band gap than that of the active layer, is firstly grown on top of the p-type AlGaInP layer using an OMVPE method. The thin GaAs layer is opaque and has a thickness from 0.01 to 0.1 μm. After the above mentioned layers have been epitaxially grown on the wafer substrate sequentially, the second window layer of p-type GaP is grown directly above the p-type GaAs layer using either OMVPE or vapor phase epitaxy (VPE) technology. The p-type GaP layer of the window layers is transparent and has a higher band gap than that of the active layer and a thickness ranging from 5 to 15 μm. An n-type electrode is deposited on the back side surface of the GaAs wafer substrate. A p-type electrode is deposited on the surface of the p-type GaP window layer. After the completion of the semiconductor fabrication process, the wafer is cut into cubic chips to form light emitting diodes.

It has been known that the growth of a GaP layer directly on a lattice mismatched AlGaInP layer is very difficult and tends to introduce defects in the interface layer that may propagate downward into the active layer. With careful composition control, the p-type GaAs thin window layer can be accurately lattice matched to the p-type AlGaInP layer. It is also easier to grow a high quality transparent GaP window layer on the GaAs window layer. Therefore, the overall yield rate is greatly improved. The smaller band gap GaAs material also has a higher conductivity than AlGaInP and GaP. Because of the higher conductivity GaAs window layer, the overall resistivity and forward voltage of the semiconductor device are decreased. The current spreading is increased and, hence, the efficiency of the light emitting device is also raised. Another advantage of the additional GaAs window layer is that the thickness of the overall window layers can be reduced due to the higher conductivity in the GaAs layer.

Although only a preferred embodiment of this invention has been described and illustrated, many modifications and variations according to the principle of this invention can be made. It is requested that all changes and modifications that come within the spirit of this invention are to be protected.

What is claimed is:

1. A light emitting diode comprising:
   a semiconductor substrate of a first conductivity type;
   a first electrode formed on a part of said substrate;
   a first confining layer of first conductivity type AlGaInP formed on said substrate;
   an active layer of undoped AlGaInP formed on said first confining layer;
   a second confining layer of second conductivity type AlGaInP formed on said active layer;
   a first window layer of second conductivity type semiconductor having high conductivity formed on said second confining layer, said first window layer having a smaller band gap than the band gap of said active layer;
   a second window layer of second conductivity type semiconductor having high conductivity formed on said first window layer, said second window layer having a higher band gap than the band gap of said active layer; and
   a second electrode formed on a part of said second window layer.

2. A light emitting diode according to claim 1, wherein said semiconductor substrate comprises GaAs.

3. A light emitting diode according to claim 1, wherein said first widow layer comprises GaAs.

4. A light emitting diode according to claim 1, wherein said second window layer comprises GaP.

* * * * *